United States Patent
Kang et al.

(10) Patent No.: US 7,358,797 B2
(45) Date of Patent: Apr. 15, 2008

(54) SEMICONDUCTOR DEVICE HAVING SECURE OPERATING CHARACTERISTIC UNDER LOW POWER ENVIRONMENT

(75) Inventors: Hee-Bok Kang, Ichon-shi (KR); Jin-Hong Ahn, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 154 days.

(21) Appl. No.: 11/320,833

(22) Filed: Dec. 30, 2005

(65) Prior Publication Data

US 2006/0244495 A1    Nov. 2, 2006

(30) Foreign Application Priority Data

Apr. 29, 2005    (KR) ...................... 10-2005-0036262

(51) Int. Cl.
   *G05F 1/10* (2006.01)
(52) U.S. Cl. ..................................... 327/544
(58) Field of Classification Search ................ 327/530, 327/534–537, 544
   See application file for complete search history.

(56) References Cited

U.S. PATENT DOCUMENTS

| | | | | |
|---|---|---|---|---|
| 5,371,705 A | * | 12/1994 | Nakayama et al. ..... | 365/185.23 |
| 5,438,542 A | * | 8/1995 | Atsumi et al. ............... | 365/182 |
| 5,452,251 A | * | 9/1995 | Akaogi et al. ............... | 365/200 |
| 5,574,691 A | * | 11/1996 | Tanida et al. ................ | 365/201 |
| 5,640,123 A | * | 6/1997 | Akaogi et al. ............... | 327/534 |
| 5,946,225 A | * | 8/1999 | Ryu et al. .................... | 365/154 |
| 6,046,956 A | * | 4/2000 | Yabe ....................... | 365/230.06 |
| 6,088,286 A | * | 7/2000 | Yamauchi et al. ...... | 365/230.06 |
| 6,333,874 B2 | | 12/2001 | Yamaguchi | |
| 6,377,508 B1 | * | 4/2002 | Tomishima et al. ..... | 365/230.06 |
| 6,429,732 B1 | * | 8/2002 | Tedrow et al. ............... | 327/548 |
| 6,654,296 B2 | * | 11/2003 | Jang et al. ............. | 365/189.09 |
| 6,774,705 B2 | * | 8/2004 | Miyazaki et al. ........... | 327/534 |
| 2001/0028591 A1 | | 10/2001 | Yamaguchi | |
| 2002/0024873 A1 | * | 2/2002 | Tomishima et al. ..... | 365/230.06 |
| 2003/0234406 A1 | | 12/2003 | Akiyama et al. | |

FOREIGN PATENT DOCUMENTS

| | | |
|---|---|---|
| JP | 7-85664 | 3/1995 |
| JP | 2004-201268 | 7/2004 |
| JP | 2005-038482 | 2/2005 |

* cited by examiner

*Primary Examiner*—N. Drew Richards
*Assistant Examiner*—William Hernandez
(74) *Attorney, Agent, or Firm*—McDermott Will & Emery LLP

(57) ABSTRACT

Provided is a semiconductor device that can secure a current consumption characteristic and an operating speed characteristic under a low power voltage environment. The semiconductor device is divided into a plurality of regions depending on the current consumption characteristics. Considering the current consumption characteristics of the corresponding regions, the ground voltage or the negative voltage is supplied as the base voltage. For example, in the memory region or the logic region, which exhibits the single transient low current characteristic, the negative voltage is supplied as the base voltage. On the contrary, in the output driver circuit region, the DLL or the PLL, which exhibits the high current characteristics, the ground voltage is supplied as the base voltage. In this case, the operating speed characteristic can be secured even under the low power supply environment without decreasing the threshold voltage of the transistor. In addition, the current consumption can be minimized in the power-down mode or the standby mode.

3 Claims, 4 Drawing Sheets

SEMICONDUCTOR DEVICE HAVING SECURE OPERATING CHARACTERISTIC UNDER LOW POWER ENVIRONMENT

FIELD OF THE INVENTION

The present invention relates to a technique for a semiconductor device design; and, more particularly, to a semiconductor device that can secure a current consumption characteristic and an operating speed characteristic under a low power voltage environment.

DESCRIPTION OF RELATED ART

Recently, developments of semiconductor devices, including a semiconductor memory device, have been made to reduce power consumption and increase operating speed. The low power consumption requires a low operating voltage of a chip, and the fast operating speed requires a rapid sweep slope of data within the chip.

As the operating voltage tends to be lower, a current drivability of a transistor within the chip is rapidly reduced. The reduction in the current drivability of the transistor causes the sweep slope of the data to decrease, thus degrading the operating speed.

Meanwhile, the degraded operating speed due to the reduced current drivability at the low operating voltage may be compensated by lowering a threshold voltage (Vt) of the transistor. However, if the threshold voltage (Vt) of the transistor is lowered, leakage component in a turned-off state of the transistor increases and thus power consumption in a power-down mode and a standby mode increases.

Accordingly, there is an increasing demand for a semiconductor device that can reduce power consumption in the power-down mode and the standby mode and can also secure an operating speed by making the threshold voltage (Vt) of the transistor sufficiently large in a low operating voltage environment.

SUMMARY OF THE INVENTION

It is, therefore, an object of the present invention to provide a semiconductor device that can secure a current consumption characteristic and an operating speed characteristic under a low power voltage environment.

In accordance with an aspect of the present invention, there is provided a semiconductor device including: a memory region and logic region receiving a power supply voltage as an excitation voltage and a negative voltage as a base voltage; and a negative voltage generator for generating the negative voltage using a ground voltage.

In accordance with another aspect of the present invention, there is provided a semiconductor device including: a single transient low current circuit region receiving a power supply voltage as an excitation voltage and a negative voltage as a base voltage; an output driver circuit region receiving the power supply voltage as an excitation voltage and a ground voltage as a base voltage; and a negative voltage generator for generating the negative voltage using the ground voltage.

In accordance with the present invention, the semiconductor device is divided into a plurality of regions depending on the current consumption characteristics. Considering the current consumption characteristics of the corresponding regions, the ground voltage or the negative voltage is supplied as the base voltage. For example, in the memory region or the logic region, which exhibits the single transient low current characteristic, the negative voltage is supplied as the base voltage. On the contrary, in the output driver circuit region, the DLL or the PLL, which exhibits the high current characteristics, the ground voltage is supplied as the base voltage. In this case, the operating speed characteristic can be secured even under the low power supply environment without decreasing the threshold voltage of the transistor. In addition, the current consumption can be minimized in the power-down mode or the standby mode.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
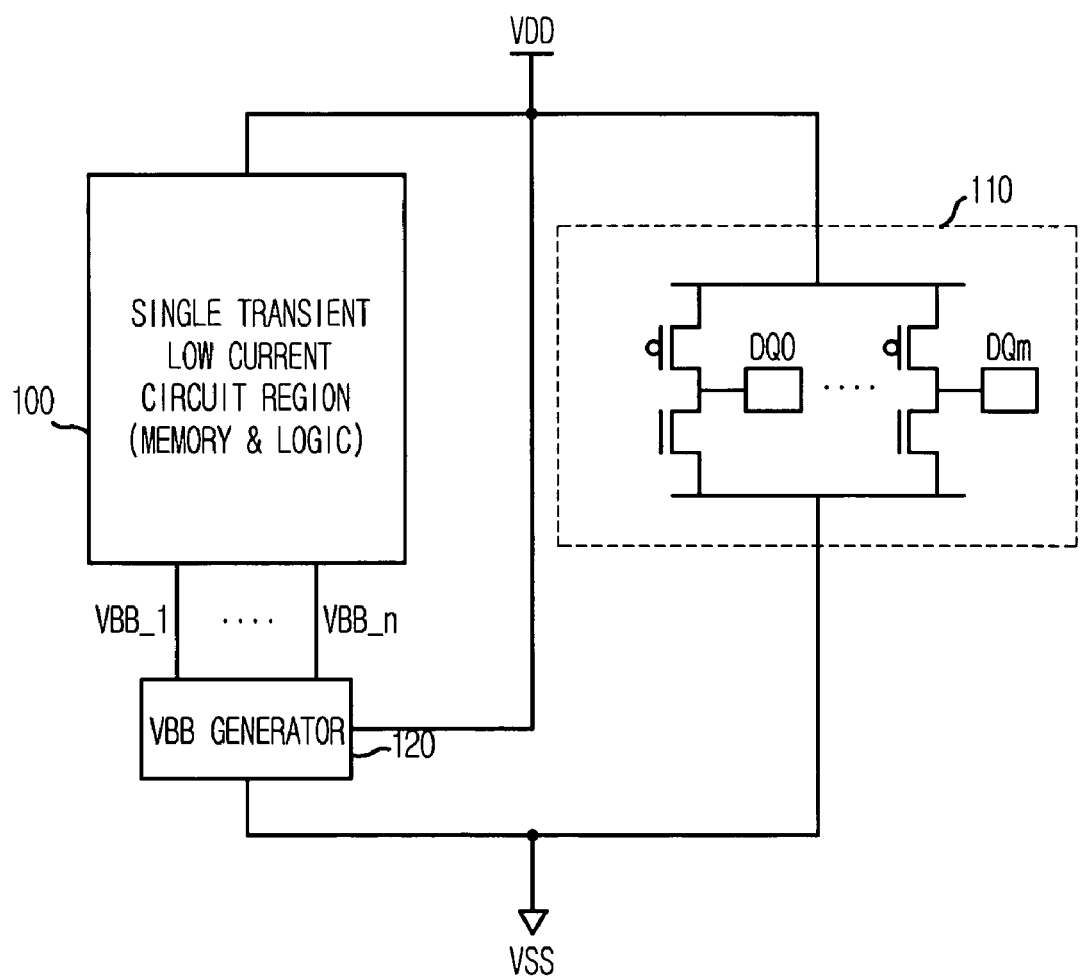
FIG. 1 is a schematic block diagram of a semiconductor device in accordance with a first embodiment of the present invention.

FIG. 1 is a block diagram of a semiconductor device in accordance with a first embodiment of the present invention.

Referring to FIG. 1, the semiconductor device is divided into two circuit regions, that is, a single transient low current circuit region 100 and an output driver circuit region 110.

The single transient low current circuit region 100 includes a memory cell region and a logic circuit region. The single transient low current circuit region 100 transfers a single transient current when a command is executed one time. That is, the single transient low current circuit region 100 transfers a signal as a single switching current characteristic. This circuit region is a low current region with a low DC current component and uses a power supply voltage VDD as an excitation voltage, and a negative voltage VBB as a base voltage. A negative voltage (VBB) generator 120 generates a plurality of negative voltages VBB_1, ..., VBB_n having different voltage levels from one another by using a ground voltage VSS. The reason for this is that the circuit regions require negative voltages of different voltage levels.

Meanwhile, since the output driver circuit region 110 drives output data, a large current is consumed. Therefore, the power supply voltage VDD and the ground voltage VSS are used as the excitation voltage and the base voltage, respectively. That is, the output driver circuit region 110 uses the ground voltage VSS to supply a pull-down current required to pull up output pads DQ0, ..., DQm.

In this embodiment, since the low current region like the single transient low current circuit region 100 uses the negative voltage as the base voltage, the operating speed can be secured even when the power supply voltage VDD is low. Also, the high current region like the output driver circuit region 110 uses the ground voltage VSS as the base voltage, considering the efficiency of the negative voltage (VBB) generator 120, thereby suppressing the increase of the power consumption. Accordingly, the operating speed characteristic can be secured even under the low power supply voltage environment. In addition, since the threshold voltage (Vt) of the transistor need not be reduced so as to secure the operating speed characteristic, leakage current in the power-down mode and the standby mode can be prevented.

Figure 2:
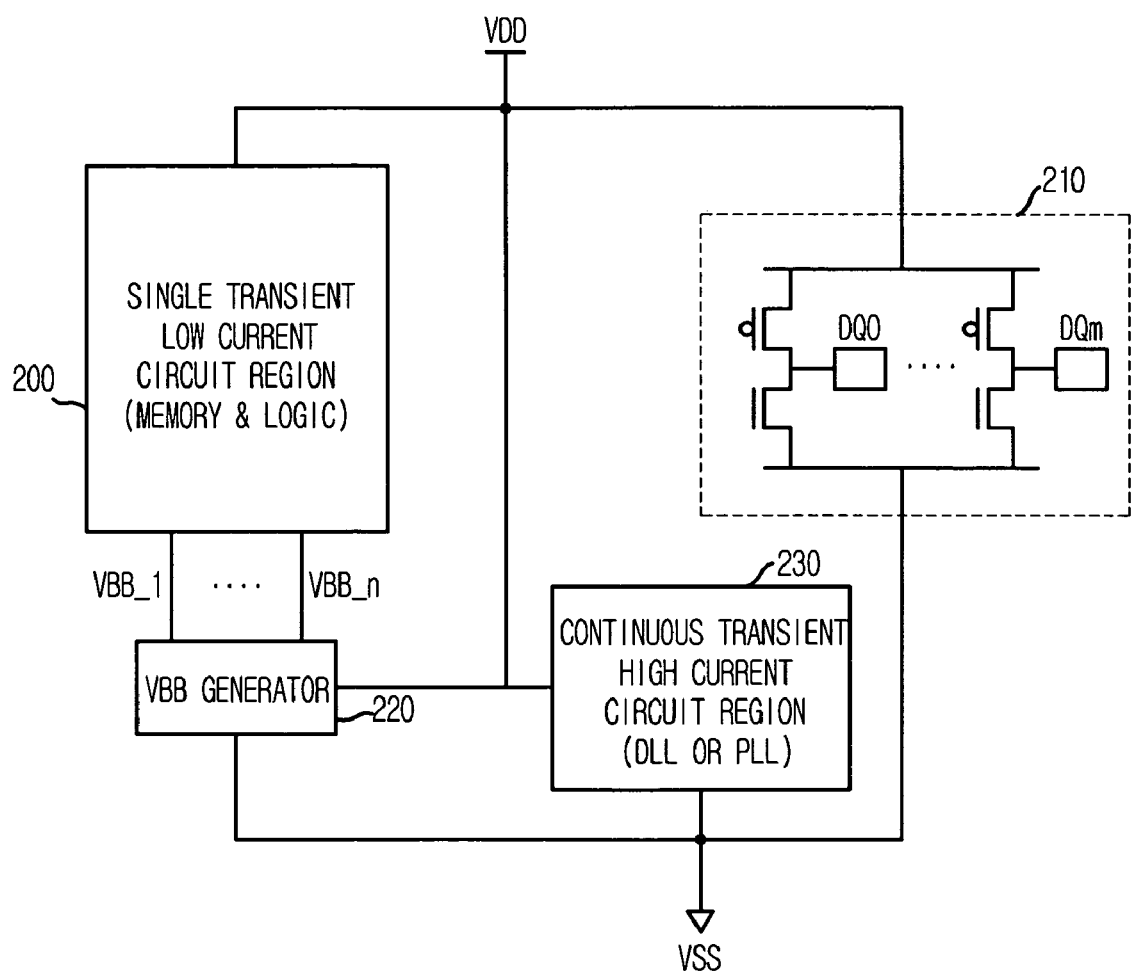
FIG. 2 is a schematic block diagram of a semiconductor device in accordance with a second embodiment of the present invention.

FIG. 2 is a block diagram of a semiconductor device in accordance with a second embodiment of the present invention.

Referring to FIG. 2, the semiconductor device is divided into three circuit regions, that is, a single transient low current circuit region 200, an output driver circuit region 210, and a continuous transient high current circuit region 230.

The single transient low current circuit region 200 includes a memory cell region and a logic circuit region. The single transient low current circuit region 200 transfers a single transient current when a command is executed one time. That is, the single transient low current circuit region 200 transfers a signal as a single switching current characteristic. This circuit region is a low current region with a small DC current component, and uses a power supply voltage VDD as an excitation voltage and a negative voltage VBB as a base voltage. A negative voltage (VBB) generator 220 generates a plurality of negative voltages VBB_1, . . . , VBB_n having different voltage levels from one another by using a ground voltage VSS. The reason for this is that the circuit regions require negative voltages of different voltage levels.

Like a delay locked loop (DLL) or a phase locked loop (PLL), the continuous transient high current circuit region 230 is a high current region with a large DC current component. Here, the DC current component is a continuous switching current, that is, a continuous transient current. The continuous transient high current circuit region 230 uses a power supply voltage VDD as an excitation voltage and a ground voltage VSS as a base voltage.

Since the output driver circuit region 210 drives output data, a large current is consumed. Therefore, the power supply voltage VDD and the ground voltage VSS are used as the excitation voltage and the base voltage, respectively.

That is, in this embodiment, since the low current region like the single transient low current circuit region 200 uses the negative voltage as the base voltage, the operating speed can be secured even when the power supply voltage VDD is low. Also, the high current region like the output driver circuit region 210 uses the ground voltage VSS as the base voltage, considering the efficiency of the negative voltage (VBB) generator 220, thereby suppressing the increase of the power consumption. Meanwhile, the high current region like the continuous transient high current circuit region 230 also uses the ground voltage VSS as the base voltage, considering the efficiency of the negative voltage (VBB) generator 220. Accordingly, the operating speed characteristic can be secured even under the low power supply voltage environment. In addition, since the threshold voltage (Vt) of the transistor need not be reduced so as to secure the operating speed characteristic, leakage current in the power-down mode and the standby mode can be prevented.

Figure 3:
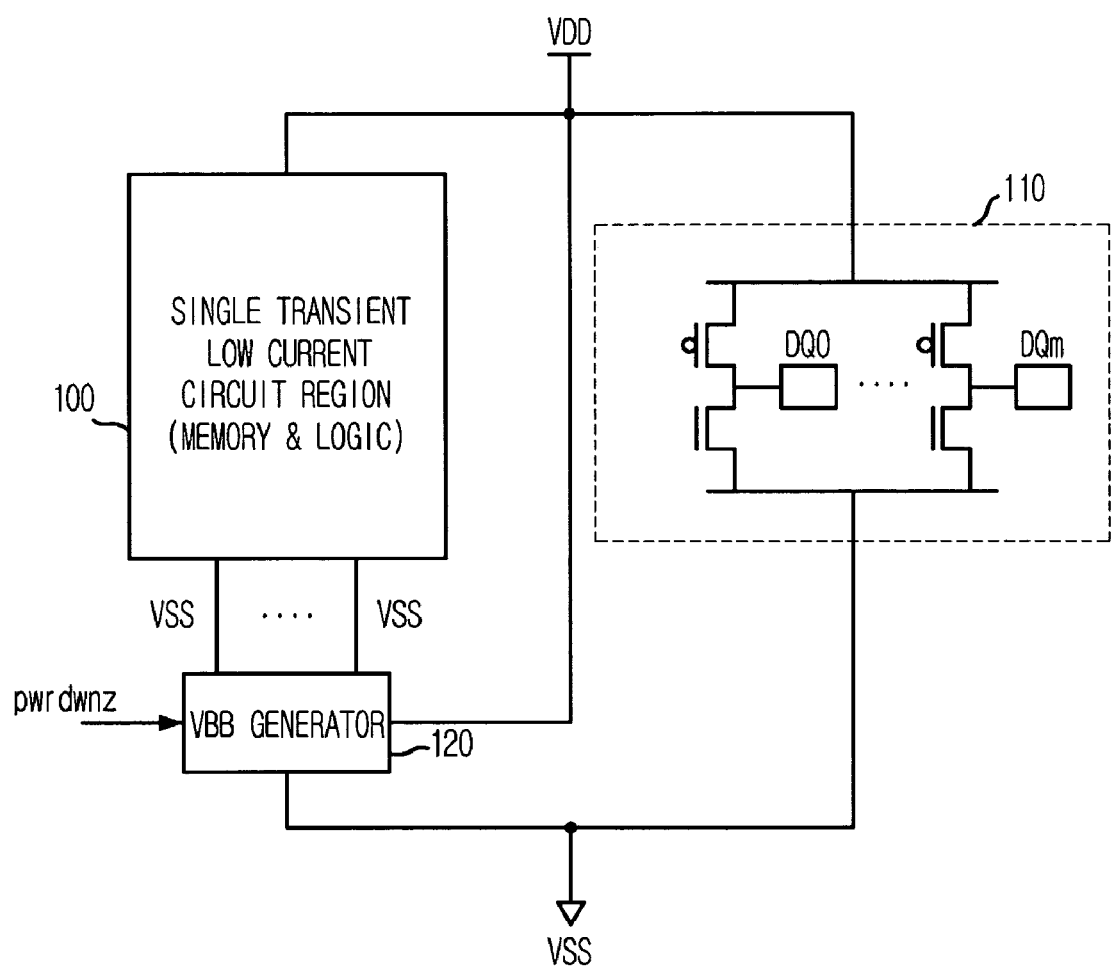
FIG. 3 is a schematic block diagram of a voltage supply status in a power-down mode of the semiconductor device in accordance with the first embodiment of the present invention.
Figure 4:
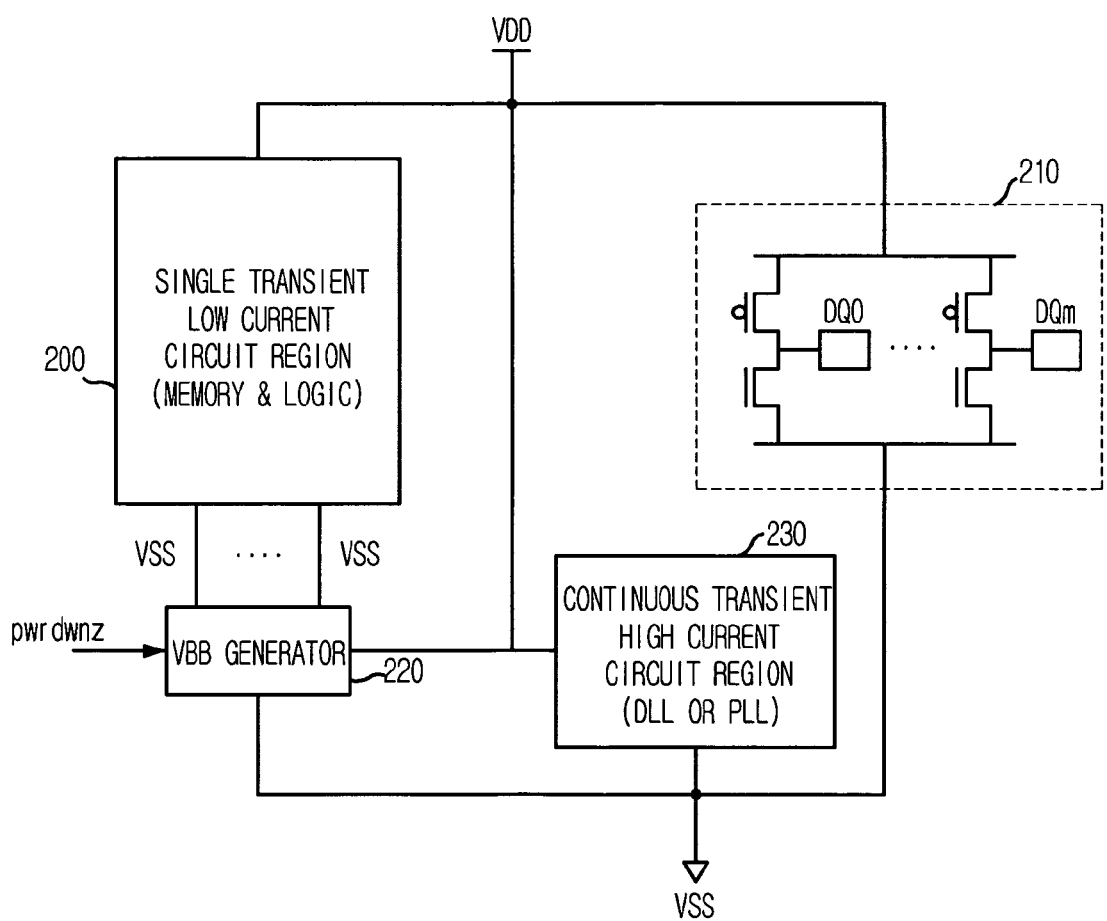
FIG. 4 is a schematic block diagram of a voltage supply status in a power-down mode of the semiconductor device in accordance with the second embodiment of the present invention.

FIG. 3 is a schematic block diagram of a voltage supply status in the power-down mode of the semiconductor device in accordance with the first embodiment of the present invention, and FIG. 4 is a schematic block diagram of a voltage supply status in the power-down mode of the semiconductor device in accordance with the second embodiment of the present invention.

Referring to FIGS. 3 and 4, a power-down signal pwrdwnz represents that the chip is in the power-down mode. The power-down signal pwrdwnz is used as an enable signal of the negative voltage (VBB) generators 120 and 220. In this case, in the power-down mode, the negative voltage (VBB) generators 120 and 220 are disabled. Therefore, the ground voltage VSS is supplied as the base voltage of the single transient low current circuit regions 100 and 200. Thus, the current consumption of the negative voltage (VBB) generators 120 and 220 can be minimized, and the degradation of the current supply efficiency in the negative voltage (VBB) generators 120 and 220 can be prevented.

Although the back bias voltage (VBB) is used as the negative voltage in the foregoing embodiments, the present invention is not limited to this. The back bias voltage (VBB) is a voltage used for a substrate bias of the NMOS transistor region. In accordance with the present invention, the negative voltages with various levels are used depending on the characteristics of the circuit regions, the negative voltages do not necessarily mean the substrate bias voltage.

As described above, different base voltages are used depending on the current consumption characteristics of the circuit regions. Therefore, even under the low power supply voltage environment, the operating speed characteristic can be secured without decreasing the threshold voltage (Vt) of the transistor. In addition, the current consumption in the power-down mode and the standby mode can be minimized, thus securing the current consumption characteristic.

The present application contains subject matter related to Korean patent application No. 2005-36262, filed in the Korean Intellectual Property Office on Apr. 29, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor device comprising:
   a single transient low current circuit region receiving a power supply voltage as an excitation voltage and a negative voltage as a base voltage;
   an output driver circuit region receiving the power supply voltage as an excitation voltage and a ground voltage as a base voltage;
   a negative voltage generator for generating the negative voltage using the ground voltage; and
   a continuous transient high current circuit region receiving the power supply voltage as an excitation voltage and the ground voltage as a base voltage,
   wherein the continuous transient high current circuit region includes a delay locked loop (DLL) or a phase locked loop (PLL).

2. The semiconductor device of claim 1, wherein the negative voltage generator is disabled in a power-down mode by using a power-down signal as an enable signal.

3. The semiconductor device of claim 1, wherein the negative generator generates a plurality of negative voltages with different voltage levels from one another.

* * * * *